United States Patent [19]

Lewis et al.

[11] Patent Number: 4,791,318

[45] Date of Patent: Dec. 13, 1988

[54] MOS THRESHOLD CONTROL CIRCUIT

[75] Inventors: Stephen R. Lewis, Reading; Scott Lefton, Melrose, both of Mass.

[73] Assignee: Analog Devices, Inc., Norwood, Mass.

[21] Appl. No.: 132,984

[22] Filed: Dec. 15, 1987

[51] Int. Cl.⁴ .................................... H03K 17/30
[52] U.S. Cl. .................... 307/297; 307/451; 307/475; 307/362
[58] Field of Search ............... 307/443, 451, 448, 475, 307/362–363, 297, 304

[56] References Cited

U.S. PATENT DOCUMENTS

| | | | |
|---|---|---|---|
| 3,609,414 | 9/1971 | Pleshko et al. | 307/304 X |
| 3,657,575 | 4/1972 | Taniguchi et al. | 307/304 |
| 4,096,402 | 6/1978 | Schroeder et al. | 307/362 |
| 4,142,114 | 2/1979 | Green | 307/304 |
| 4,435,652 | 3/1984 | Stevens | 307/297 |
| 4,612,461 | 9/1986 | Sood | 307/475 |
| 4,647,798 | 3/1987 | Crafts et al. | 307/451 |
| 4,691,127 | 9/1987 | Huizer | 307/297 X |

OTHER PUBLICATIONS

Frantz, "Threshold Voltage Control for N-Channel MOSFET Devices", IBM T.D.B., vol. 12, No. 12, May 1970, p. 2078.

Chang, "FET N-Channel Threshold Voltage-Control Circuit", IBM T.D.B., vol. 17, No. 1, Jun. 1974, p. 140.

*Primary Examiner*—Stanley D. Miller
*Assistant Examiner*—D. R. Hudspeth
*Attorney, Agent, or Firm*—Wolf, Greenfield & Sacks

[57] ABSTRACT

A circuit for controlling the circuit thresholds on an MOS integrated circuit takes advantage of the fact that all MOS devices of a particular type on the same chip have nearly identical characteristics. The circuit thresholds are varied by applying a control voltage to the back gate of an MOS device in each stage to be controlled. The control voltage is generated in a reference stage which utilizes a feedback loop to servo the back gate voltage of an MOS transistor in the loop. A reference voltage equal to the desired circuit threshold votlage is applied to the input of the reference stage. The reference voltage and the reference stage output are applied to an amplifier in the feedback loop. The amplifier applies to the back gate of the MOS transistor in the reference stage a control voltage that tends to equalize or establish a desired offset between the reference voltage and the reference stage output. The control voltage applied to the reference stage back gate is coupled to the back gate of the MOS transistor in each operating stage. The threshold control circuit is particularly useful in CMOS circuits, but can be utilized in any MOS circuit having an MOS transistor with an accessible back gate.

14 Claims, 1 Drawing Sheet

MOS THRESHOLD CONTROL CIRCUIT

FIELD OF THE INVENTION

This invention relates to MOS integrated circuits and, more particularly, to a circuit for establishing a prescribed threshold voltage and for controlling the threshold voltage of one or more MOS circuits in an integrated circuit to mitigate the effects of process variations, temperature variations, and other factors which may cause the threshold voltage to vary.

BACKGROUND OF THE INVENTION

MOS integrated circuits have gained wide acceptance in the electronics industry. Although "MOS" is an acronym for metal oxide semiconductor, conductive polysilicon gate transistors are now more common than metal gate transistors. As used herein, the acronym "MOS" refers generally to conductor oxide semiconductor devices wherein the gate can be metal, conductive polysilicon or any other conductor. The MOS transistors which are utilized in such integrated circuits are characterized by a threshold gate-to-source voltage required for the transistor to turn on and to conduct drain current. The threshold voltage is susceptible to manufacturing process variations and temperature variations. In many cases, threshold voltage variations are tolerable. In other cases, however, such threshold voltage variations are detrimental to circuit performance. For example, when the inputs to an MOS integrated circuit must be compatible with TTL logic or some other logic family, threshold voltages must be maintained within the limits of the logic family. It is known that the threshold voltages of all MOS devices on an integrated circuit tend to be matched and to track each other, since they are subject to the same temperature variations and the same manufacturing process.

In the past, threshold voltages of MOS circuits have been controlled by relatively complex circuitry. For example, an on-chip variable voltage supply can be utilized since the circuit threshold voltage varies with the supply voltage. Prior art techniques have not been satisfactory since the circuitry occupies a significant part of the chip area, requires significant current for operation, and tends to be difficult to stabilize.

It is a general object of the present invention to provide a circuit for controlling the threshold voltage of integrated circuits utilizing MOS transistors.

It is another object of the present invention to provide an MOS integrated circuit having an onboard circuit for controlling the threshold voltages of one or more of the MOS devices on the integrated circuit.

It is a further object of the present invention to provide an MOS threshold control circuit which requires a relatively small current.

It is yet another object of the present invention to provide an MOS threshold control circuit that is simple in construction and requires a relatively small chip area.

It is another object of the present invention to provide an MOS threshold control circuit which maintains stable threshold voltages during temperature variations.

SUMMARY OF THE INVENTION

According to the present invention, these and other objects and advantages are achieved in a monolithic integrated circuit including a circuit for establishing and controlling the threshold voltage of one or more of the operating stages on the chip. The monolithic integrated circuit comprises at least one MOS operating stage including an MOS device having a back gate, a reference stage including an input, an output and an MOS reference device having a back gate, means for applying a reference voltage to the input of the reference stage, the reference voltage being equal to the desired operating stage threshold voltage, feedback means for providing a control voltage to the back gate of the MOS reference device for maintaining a prescribed relationship between the reference voltage and a voltage at the output, the control voltage being coupled to the back gate of the MOS operating device. The feedback means controls the threshold voltage of both the reference device and the operating device at the reference voltage by applying the control voltage to the respective back gates. Since the operating stage and the reference stage are on the same integrated circuit and have nearly identical characteristics, the control voltage applied to the back gates establishes essentially the same threshold voltage for both the reference stage and the operating stage. Typically, a number of operating stage threshold voltages are controlled by the control voltage.

Preferably, the reference stage comprises a p-channel MOS device and an n-channel MOS device coupled in a complementary MOS (CMOS) configuration. The feedback means can comprise an amplifier having an inverting input coupled to the input of the reference stage and a noninverting input coupled to the output of the reference stage. An offset voltage source of predetermined value can be coupled between the output of the reference stage and the input of the amplifier for establishing different voltages at the input and the output of the reference stage.

The MOS threshold control circuit of the present invention can be applied in any MOS circuit having an accessible back gate and is particularly useful in either n-well or p-well CMOS circuits. Since the control voltage is applied to the back gate of the MOS devices, very little current is required and a large number of operating stages can be controlled with a single reference stage.

BRIEF DESCRIPTION OF THE DRAWINGS

For a better understanding of the present invention together with other and further objects, advantages and capabilities thereof, reference is made to the accompanying drawings which are incorporated herein by reference and in which.

DETAILED DESCRIPTION OF THE INVENTION

Figure 1:
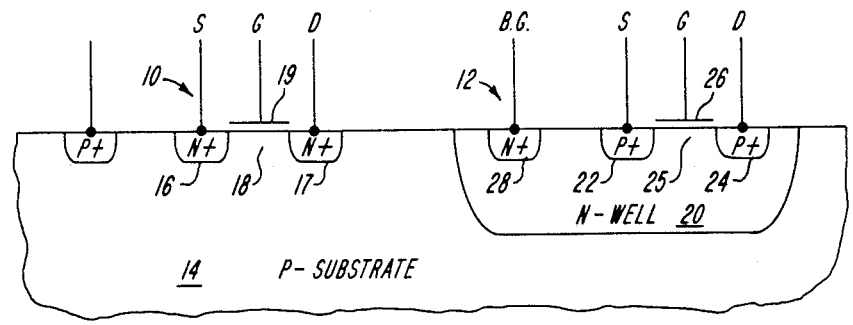
FIG. 1 is a partial cross-sectional view of a CMOS integrated circuit illustrating a back gate connection.

A cross-sectional view of a typical n-well CMOS circuit is shown in FIG. 1. An NMOS transistor 10 and a PMOS transistor 12 are fabricated on a P− type substrate 14. The NMOS transistor 10 includes spaced-apart N+ regions which define a source 16 and a drain 17 with a channel 18 between them. A gate 19 is positioned above the channel 18. The PMOS transistor 12 is formed in an n-well 20 in substrate 14. The PMOS transistor 12 includes spaced-apart P+ regions that define a source 22 and a drain 24 with a channel 25 between them. A gate 26 is positioned over the channel 25.

The n-well 20 is effectively a back gate for the PMOS transistor 12 and is accessible by means of an N+ contact region 28 formed in n-well 20. The n-well 20 acts as a back gate opposite gate 26 for modulating the current through the channel 25. All MOS transistors on an integrated circuit that are similar in construction to PMOS transistor 12 have separately accessible back gates. Likewise, when a p-well process is used, the NMOS transistors have separately accessible back gates. With reference to NMOS transistor 10, the substrate 14 is the effective back gate and is not suitable for application of a control voltage since it is common to all NMOS transistors on the chip.

In accordance with the present invention, a control voltage is applied to the back gate of PMOS transistor 12. The voltage applied to back gate 28 controls the threshold voltage which must be applied to gate 26 to cause conduction of the transistor. The control voltage is derived from a reference stage on the same integrated circuit. The reference stage is connected in a feedback loop that controls the back gate voltage so as to maintain a substantially constant threshold voltage of predetermined value. The back gate control voltage of the reference stage is applied to the back gates of those operating stages on the integrated circuit for which threshold voltage control is required.

Figure 2:
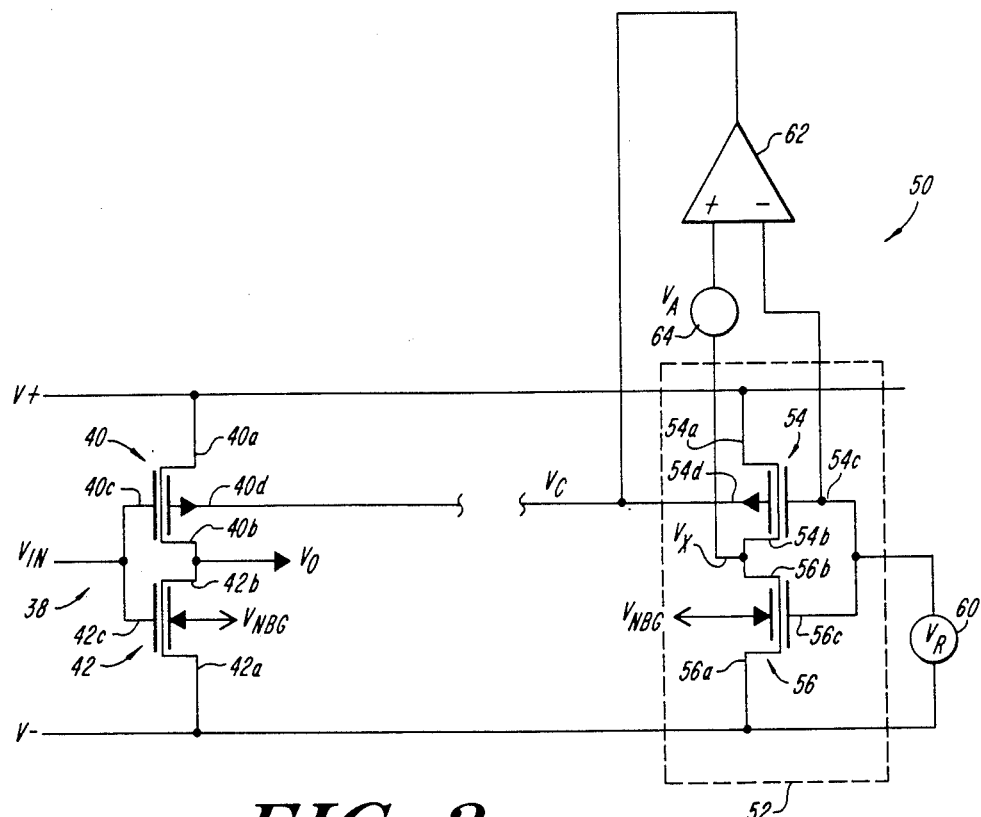
FIG. 2 is a schematic diagram of an MOS threshold control circuit in accordance with the present invention.

A schematic diagram of a threshold control circuit in accordance with the present invention is shown in FIG. 2. A CMOS operating stage 38 shown as a simple inverter includes a PMOS transistor 40 and an NMOS transistor 42 coupled in a CMOS configuration. The source 40a of PMOS transistor 40 is coupled to a positive supply voltage V+, and the source 42a of NMOS transistor 42 is coupled to a negative supply voltage, V− or ground. The drains 40b, 42b of transistors 40 and 42 are coupled together and form an output of the CMOS stage. The gates 40c, 42c of transistors 40 and 42 are coupled together and form an input to the circuit. A typical integrated circuit may include a large number of CMOS stages the same or similar to the stage 38 shown in FIG. 2 to perform a predetermined function.

In accordance with the present invention, the threshold voltages of the operating CMOS stages are controlled by a threshold control circuit 50. A reference stage 52 includes a PMOS transistor 54 and an NMOS transistor 56 connected in a CMOS configuration. The source 54a of transistor 54 is coupled to V+, and the source 56a of transistor 56 is coupled to V− or ground. The drains 54b and 56b of transistors 54 and 56 are coupled together and form an output.

A voltage source 60 provides a reference voltage $V_R$ to commonly-coupled gates 54c, 56c of transistors 54 and 56. The voltage source 60 is also coupled to the inverting input of an amplifier 62. The output voltage $V_X$ of the reference stage 52 at the commonly-coupled drains 54b, 56b is coupled to one terminal of a voltage source 64 which provides a voltage $V_A$. The other terminal of voltage source 64 is coupled to the noninverting input of amplifier 62. The voltage $V_A$ of voltage source 64 is added to the output voltage $V_X$. As a result, the voltage $V_A + V_X$ is applied to the noninverting input of amplifier 62. The voltage source 64 is optional, depending on the desired parameters of operation, and can be replaced in some applications with a direct connection between the output of the reference stage 52 and the noninverting input of amplifier 62. The output of amplifier 62 is a control voltage $V_C$ coupled to the back gate 54d of PMOS transistor 54. The output control voltage $V_C$ from amplifier 62 is also coupled to the back gate 40d of PMOS transistor 40 in operating stage 38, so as to control the CMOS operating stage threshold voltage, and is commonly coupled to the back gates of all other CMOS operating stages which require threshold voltage control.

The gates 54c, 56c of transistors 54 and 56 are maintained at the reference voltage $V_R$ where voltage $V_R$ is the desired circuit threshold voltage. A ratio, $S_P$, of width, $Z_P$, to length, $L_P$, is defined for PMOS transistor 54, and a ratio, $S_N$, of width, $Z_N$, to length, $L_N$, is defined for NMOS transistor 56. Transistors 54 and 56 are scaled so that, at nominal processing and temperature and for prescribed values of reference voltage $V_R$ and control voltage $V_C$, the ratio $S_P = Z_P/L_P$ relative to the ratio $S_N = Z_N/L_N$ will yield a value of output voltage $V_X$ which, when added to voltage $V_A$, equals reference voltage $V_R$. The prescribed value of reference voltage $V_R$ is the desired circuit threshold, and the prescribed value of control voltage $V_C$ is a potential about ¼ of the way between supply voltage +V and the most positive extent of the span of control voltage $V_C$. The back gate 56d of NMOS transistor 56 is held at a potential $V_{NBG}$ which can change and which is one of the operational variations that the threshold control circuit of the present invention corrects. Reference voltage $V_A$ is a bias voltage that causes operation at a level other than $V_X = V_R$.

The amplifier 62 is connected so that the control voltage $V_C$ adjusts the back gate potential of PMOS transistor 54 and changes the magnitude of the PMOS threshold voltage. The drain current $I_D$ of the PMOS transistor 54 is varied so that $V_X + V_A = V_R$. The magnitude of the threshold voltage of the PMOS transistor 54 increases with more positive back gate bias relative to the PMOS transistor source. Since the PMOS transistor threshold voltage is defined as a gate-to-source voltage, it is measured relative to supply voltage V+, and an increase in its magnitude decreases the circuit threshold. Therefore, an increase in the back gate voltage reduces the circuit threshold.

In operation, the amplifier 62 applies the control voltage $V_C$ to back gate 54d which causes $V_A + V_X = V_R$. Since $V_X$ is a voltage between V+ and V−, the reference stage 52 is not fully on or fully off, but is biased in a linear region at the threshold point. Therefore, the control voltage $V_C$ applied to back gate 54d forces the reference stage 52 to operate with a circuit threshold $V_R$. Furthermore, all similar devices on a chip can be expected to have nearly identical characteristics. Therefore, application of the control voltage $V_C$ to back gate 40d, and to the back gates of other operating stages that must be controlled, causes the circuit threshold of those operating stages to be equal to $V_R$. The back gate voltage modulation effects on the threshold of conduction for a PMOS transistor are given by $$V_{th} = V_{to} - M[(V_{SB} + 2\phi_F)^{\frac{1}{2}} - (2\phi_F)^{\frac{1}{2}}] \tag{1}$$

and for an NMOS transistor are given by $$V_{th} = V_{to} + M[(V_{SB} + 2\phi_F)^{\frac{1}{2}} - (2\phi_F)^{\frac{1}{2}}] \tag{2}$$

where $V_{TH}$ = threshold voltage including back gate effect.

$V_{TO}$ = threshold voltage with zero volts between the source and back gate (typically, +1 volt for NMOS, −1 volt for PMOS).

M = back gate effect factor which ranges from 0.3 to 3.0 typically, and is nominally constant for a particular device type in a particular process. M is dependent on silicon doping levels and profiles.

$V_{SB}$ = the voltage magnitude of the source to back gate voltage (reversed bias only).

$2\phi_F$ = voltage magnitude of the contact potential, typically around 0.6 volt.

The control voltage applied to the back gate of transistor 54 must be equal to or greater than the positive supply voltage V+ since the back gate-to-source junction cannot be forward biased. Therefore, in order to use the MOS threshold control circuit of the present invention for controlling a PMOS transistor back gate, a potential more positive than V+, the PMOS source potential, must either be supplied to the chip or generated on the chip for operation of amplifier 62. Since only the back gates are to be driven, the current requirements for this positive supply are small and can be obtained by an on-chip voltage boosting scheme.

It will be understood that if the MOS process is a p-well process, the threshold control circuit of the present invention can be utilized with the NMOS transistor back gates being modulated to adjust stage thresholds. The threshold control circuit 50 of FIG. 2 can be utilized for a p-well process, except that amplifier 62 supplies a control voltage to the back gate of the NMOS transistor that is equal to or more negative than the negative voltage supply V−. In either case, protection against allowing the back gate to forward bias the MOS device in the well is required. The threshold control circuit of the present invenion is useful not only on CMOS stages, but on any circuit where MOS threshold modulation can effect a desired circuit threshold adjustment.

Because of the nonlinear square root effect of $V_{SB}$ on $V_{TH}$, the control voltage $V_C$ is designed to be at about ¼ of its total span above V+ when all parameters are at their nominal center values. Variations affecting the circuit in either direction from the center values are mitigated by back gate voltage changes in either direction from the nominal. In an example of the present invention, $V_R = V_X = 1.25$ volts, $V_A = 0$, V+ = 4.5 to 5.5 volts and V− = 0. In this case, the required back gate control voltage $V_C$ is about +7 to +8 volts when devices and operating parameters are at nominal center values. The design of the span of control voltage $V_C$ must take into consideration the degree of control needed and the total parametric variation to be mitigated. In many cases sufficient control of the circuit threshold can be obtained over wide parametric variations with control voltage $V_C$ hitting its span limits. In the above example, the circuit threshold limits are between 0.8 V and 2.0 V. This allows the control voltage $V_C$ span to be smaller than would be needed if the threshold limits were much tighter, say 1.2 V to 1.3 V.

While there has been shown and described what is at present considered the preferred embodiments of the present invention, it will be obvious to those skilled in the art that various changes and modifications may be made therein without departing from the scope of the invention as defined by the appended claims.

What is claimed is:

1. Apparatus for controlling a threshold voltage of a circuit including an MOS operating device having a back gate, comprising:
   a reference stage including an input, an output and an MOS reference device having a back gate;
   means for applying a reference voltage $V_R$ to the input of said reference stage, said reference voltage $V_R$ being equal to the desired circuit threshold voltage; and
   feedback means for providing a control voltage to the back gate of said MOS reference device for maintaining a prescribed relationship between said reference voltage and a voltage $V_X$ at said output, said control voltage being coupled to the back gate of said MOS operating device.

2. Apparatus as defined in claim 1 wherein said feedback means comprises amplifier means responsive to said reference voltage $V_R$ and to said output voltage $V_X$ for providing said control voltage.

3. Apparatus as defined in claim 2 wherein said amplifier means comprises an operational amplifier having an inverting input coupled to the input of said reference stage and a noninverting input coupled to the output of said reference stage.

4. Apparatus as defined in claim 3 further including a voltage source $V_A$ coupled between the output of said reference stage and the input of said operational amplifier for establishing the operation of said reference stage so that $V_R = V_X + V_A$.

5. Apparatus as defined in claim 1 wherein the threshold voltage of said circuit is controlled for TTL compatibility.

6. Apparatus as defined in claim 1 wherein said reference stage comprises a p-channel MOS device and an n-channel MOS device coupled in a complementary MOS configuration and wherein said p-channel device is said MOS reference device.

7. A monolithic integrated circuit comprising:
   at least one MOS operating stage including an MOS device having a back gate;
   a reference stage including an input, an output and an MOS reference device having a back gate;
   means for applying a reference voltage $V_R$ to the input of said reference stage, said reference voltage $V_R$ being equal to a desired operating stage threshold voltage; and
   feedback means providing a control voltage to the back gate of said MOS reference device for maintaining a prescribed relationship between said reference voltage and a voltage $V_X$ at said output, said control voltage establishing the threshold voltage of said reference stage and being coupled to the back gate of said MOS operating device.

8. An integrated circuit as defined in claim 7 wherein said feedback means comprises amplifier means responsive to said reference voltage $V_R$ and to said output voltage $V_X$ for providing said control voltage.

9. An integrated circuit as defined in claim 8 wherein said reference stage comprises a p-channel MOS device and an n-channel MOS device coupled in a complementary MOS configuration.

10. An integrated circuit as defined in claim 9 wherein said amplifier means comprises an operational amplifier having an inverting input coupled to the input of said reference stage and a noninverting input coupled to the output of said reference stage.

11. An integrated circuit as defined in claim 10 further including a voltage source $V_A$ value coupled between the output of said reference stage and the input of said operational amplifier for establishing the operation of said reference stage so that $V_R = V_X + V_A$.

12. An integrated circuit as defined in claim 11 wherein the threshold of said MOS operating stage is controlled for TTL compatibility.

13. A monolithic integrated circuit comprising:
- a plurality of MOS operating stages, each including an MOS device having a back gate;
- a reference stage including an input, an output and an MOS reference device having a back gate;
- means for applying a reference voltage $V_R$ to the input of said reference stage, said reference voltage $V_R$ being equal to a desired operating stage threshold voltage;
- amplifier means for applying a control voltage to the back gate of said MOS reference device;
- means coupling said reference voltage $V_R$ to said amplifier means;
- means coupling a voltage $V_X$ at said output plus an offset voltage $V_A$ to said amplifier means, said amplifier means being responsive to a difference between said reference voltage $V_R$ and the sum of said output voltage $V_X$ and said offset voltage $V_A$ for applying a control voltage to the back gate of said MOS reference device so as to reduce said difference, said control voltage being coupled to the back gate of said MOS device in each MOS operating stage.

14. An integrated circuit as defined in claim 13 wherein said offset voltage $V_A$ is zero.

* * * * *